(12) United States Patent
Chae et al.

(10) Patent No.: US 12,538,560 B2
(45) Date of Patent: Jan. 27, 2026

(54) METHODS FOR FABRICATING ISOLATION STRUCTURES USING DIRECTIONAL BEAM PROCESS

(71) Applicant: Tokyo Electron Limited, Tokyo (JP)

(72) Inventors: Soo Doo Chae, Albany, NY (US); Matthew Baron, Albany, NY (US); Hojin Kim, Albany, NY (US); Sunghil Lee, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 559 days.

(21) Appl. No.: 17/975,349

(22) Filed: Oct. 27, 2022

(65) Prior Publication Data

US 2024/0145312 A1 May 2, 2024

(51) Int. Cl.
| | |
|---|---|
| *H10D 84/03* | (2025.01) |
| *H01L 21/306* | (2006.01) |
| *H01L 21/762* | (2006.01) |
| *H01L 21/768* | (2006.01) |
| *H01L 23/48* | (2006.01) |
| *H01L 23/528* | (2006.01) |
| *H10D 84/01* | (2025.01) |
| *H10D 84/83* | (2025.01) |
| *H10D 88/00* | (2025.01) |

(52) U.S. Cl.
CPC ..... *H10D 84/038* (2025.01); *H01L 21/30625* (2013.01); *H01L 21/76224* (2013.01); *H10D 84/0151* (2025.01)

(58) Field of Classification Search
CPC ........... H01L 23/5286; H01L 21/76898; H01L 23/481; H10D 30/6735
See application file for complete search history.

(56) References Cited

U.S. PATENT DOCUMENTS

| | | | |
|---|---|---|---|
| 7,968,422 B2 * | 6/2011 | Hautala ............ | H01L 21/76224 257/E21.546 |
| 2022/0320089 A1 * | 10/2022 | Chu .................. | H10D 84/0181 |
| 2022/0320090 A1 * | 10/2022 | Hsu ................... | H10D 30/6739 |
| 2023/0299000 A1 * | 9/2023 | Xie .................... | H01L 23/5286 257/401 |
| 2024/0021497 A1 * | 1/2024 | Liao ................... | H10D 84/83 |

* cited by examiner

*Primary Examiner* — Sonya McCall-Shepard
(74) *Attorney, Agent, or Firm* — Foley & Lardner LLP (57) ABSTRACT

A method for fabricating semiconductor devices is disclosed. The method includes forming, on a first side of a substrate, a first stack and a second stack. The method includes etching, from the first side, a portion of the substrate interposed between the first and second stacks to form a recess. The method includes filling the recess with a dielectric material to form an isolation structure. The method includes forming, on the first side, one or more first interconnect structures over the first and second stacks. The method includes removing, from a second side of the substrate opposite to the first side, a remaining portion of the substrate. The method includes forming a via structure extending through at least the isolation structure. The method includes forming, on the second side, one or more second interconnect structures.

17 Claims, 6 Drawing Sheets

METHODS FOR FABRICATING ISOLATION STRUCTURES USING DIRECTIONAL BEAM PROCESS

FIELD OF THE DISCLOSURE

This disclosure relates generally to isolation structures for semiconductor processing and in particular to methods for manufacturing isolation structures of semiconductor devices.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

SUMMARY

At least one aspect of the present disclosure is directed to a method for fabricating semiconductor devices. The method may include forming, on a first side of a substrate, a first stack and a second stack; etching, from the first side, a portion of the substrate interposed between the first and second stacks to form a recess; filling the recess with a dielectric material to form an isolation structure; forming, on the first side, one or more first interconnect structures over the first and second stacks; removing, from a second side of the substrate opposite to the first side, a remaining portion of the substrate; forming a via structure extending through at least the isolation structure; and forming, on the second side, one or more second interconnect structures.

Each of the first and second stacks may include a plurality of first semiconductor layers and a plurality of second semiconductor layers alternately stacked on top of one another. The method may further include removing the plurality of second semiconductor layers of the first and second stacks; and forming a first metal gate structure around each of the plurality of first semiconductor layers of the first stack and a second metal gate structure around each of the plurality of first semiconductor layers of the second stack.

At least one of the one or more first interconnect structures may be connected to at least one of the one or more second interconnect structures through the via structure.

The step of filling the recess with a dielectric material may further comprise utilizing gas cluster ion beam to deposit the dielectric material. The dielectric material includes silicon nitride.

The step of removing a remaining portion of the substrate may further include polishing a first remaining portion of the substrate until a bottom surface of the isolation structure is exposed; and etching a second remaining portion of the substrate to expose partial sidewalls of the isolation structure. The dielectric material is configured to stop the polishing step. The method further includes depositing, on the second side, an oxide material to overlay at least the bottom surface and the exposed sidewalls of the isolation structure. The via structure further extends through the oxide material.

At least another aspect of the present disclosure is directed to a method for fabricating semiconductor devices. The method may include etching, from a first side of a substrate, a portion of the substrate to form a recess; filling the recess with a dielectric material to form an isolation structure; forming, on the first side, a first interconnect structure; polishing, from a second side of the substrate, a first remaining portion of the substrate until a bottom surface of the isolation structure is exposed; etching, from the second side, a second remaining portion of the substrate; forming a via structure extending through at least the isolation structure; and forming, on the second side, a second interconnect structure in connection with the first interconnect structure through the via structure.

The dielectric material may include silicon nitride.

The dielectric material may be configured to stop the polishing step.

The method may further include depositing, on the second side, an oxide material. The via structure may further extend through the oxide material.

The method may further include forming, on the first side, a stack over the substrate, wherein the stack includes a plurality of first semiconductor layers and a plurality of second semiconductor layers alternately stacked on top of one another; and prior to forming the recess, separating the stack into a first portion and a second portion, wherein the recess in interposed between the first and second portions of the stack.

The step of filling the recess with a dielectric material may further include utilizing gas cluster ion beam to deposit the dielectric material.

Yet another aspect of the present disclosure may be directed to a semiconductor device. The semiconductor device may include a first transistor; a second transistor; an isolation structure interposed between the first transistor and the second transistor, wherein the isolation structure is configured to electrically isolate the first transistor and the second transistor from each other; a via structure extending through the isolation structure and extending between the first and second transistors; a first interconnect structure in contact with a first end of the via structure; and a second interconnect structure in contact with a second end of the via structure.

Each of the first and second transistors may include a plurality of corresponding semiconductor channels wrapped by a corresponding gate structure.

The isolation structure may include silicon nitride.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustrations and a further understanding of the various aspects and implementations, and are incorporated in and constitute a part of this specification. Aspects can be combined, and it will be readily appreciated that features described in the context of one aspect of the invention can be combined with other aspects. Aspects can be implemented in any convenient form. As used in the specification and in the claims, the singular form of "a," "an," and "the" include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings.

DETAILED DESCRIPTION

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

In integrated circuit manufacturing processes, a number of devices (e.g., transistors) are formed along the front surface of a semiconductor substrate. These devices are electrically isolated from each other by one or more isolation regions/structures. Shallow Trench Isolation (STI) structures are commonly used as such isolation structures to electrically isolate respective active regions of the devices. Typically, STI structures are formed of a dielectric material or dielectric materials filled into trenches in the semiconductor substrate. As a density of the devices formed over the semiconductor substrate becomes ever higher, forming the corresponding trenches has become increasingly challenging. For example, even though all trenches should have a similar depth, some of the trenches may have an insufficient depth (sometimes referred to as a "loading effect"). This can cause some of the later formed STI structures to have insufficient dielectric material being filled, which can disadvantageously result in leakage from the devices that are supposed to be isolated from those STI structures. As such, the existing methods for forming isolation structures have not been entirely satisfactory in some aspects.

The present disclosure provides various embodiments of methods for forming an isolation structure of a semiconductor device. In some embodiments, the semiconductor device may include a number of transistors formed over a substrate that are electrically isolated from one another with the isolation structure. Each of the transistors may be configured in any of various transistor structures (e.g., gate-all-around (GAA) transistor structures, FinFET structures, channel-all-around (CAA) transistor structures, etc.). The method, as disclosed herein, can include a directional deposition process that can fill a recess formed along a first side (e.g., frontside) surface of the substrate. As such, the isolation structure, formed by the disclosed method, can have its depth well controlled, with minimal deposition along surrounding sidewalls. Further, in some embodiments, the isolation structure can have a dielectric material (e.g., silicon nitride) that makes the isolation structure an ideal candidate to stop a polishing process performed from a second side (e.g., backside) surface of the substrate. Accordingly, one or more interconnect structures (e.g., power rails) can be more efficiently formed along the second side surface.

Figure 1:
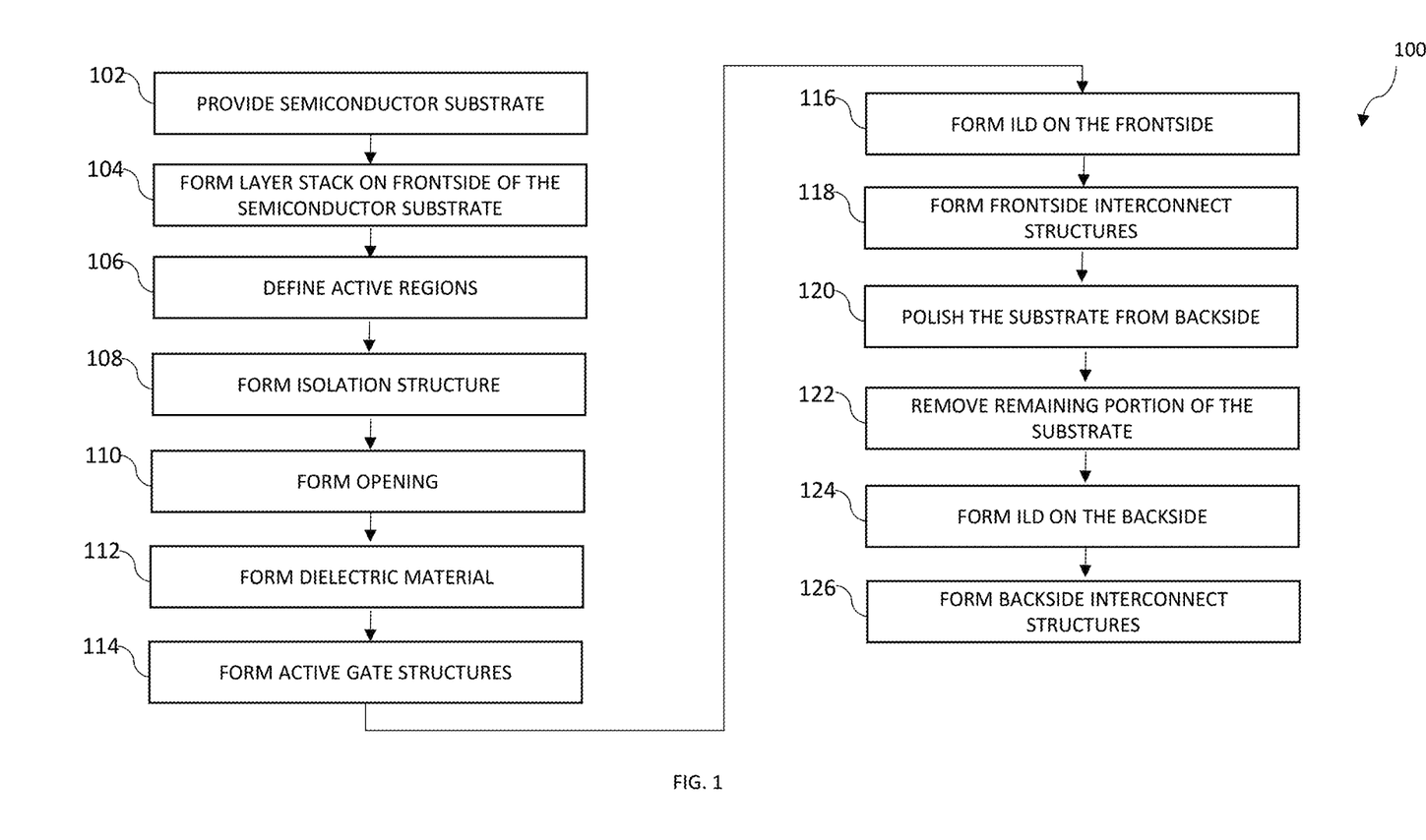
FIG. 1 illustrates a flowchart of a method to form isolation structures for a transistor structure, according to an embodiment.

FIG. 1 illustrates a flowchart of a method 100 to form isolation structures for a transistor structure, according to one or more embodiments of the present disclosure. For example, at least some of the operations (or steps) of the method 100 can be used to form isolation structures that can electrically isolate neighboring devices in a FinFET structure, a GAA transistor structure, a CAA transistor structure, a vertical transistor structure, or the like. It is noted that the method 100 is merely an example, and is not intended to limit the present disclosure. Accordingly, it is understood that additional operations may be provided before, during, and after the method 100 of FIG. 1, and that some other operations may only be briefly described herein.

In some embodiments, operations of the method 100 may be associated with cross-sectional views of an example semiconductor device 200 (e.g., a portion of a GAA transistor structure) at various fabrication stages as shown in FIGS. 2-15, respectively, which will be discussed in further detail below. It should be understood that the semiconductor device 200 shown in FIGS. 2-15 is not a completed GAA transistor structure for the purposes of brevity. For example, the following figures of the semiconductor device 200 may not illustrate or include source/drain structures coupled to opposite sides of each of the channels or a gate electrode wrapping around each of the channels.

Figure 2:
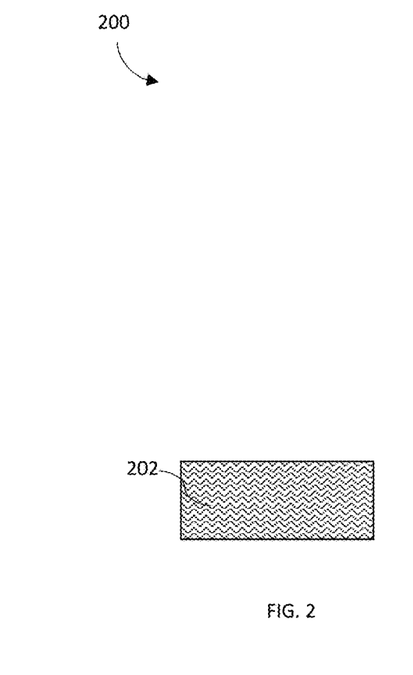
FIGS. 2-15 show cross-sectional views of a device during various fabrication stages of the method of FIG. 1, according to an embodiment.

Corresponding to operation 102 of FIG. 1, FIG. 2 is a cross-sectional view of the GAA transistor structure 200 including a semiconductor substrate 202 at one of the various stages of fabrication. In some embodiments, the cross-sectional view of FIG. 2 may be cut in a direction perpendicular to the lengthwise direction of one or more channels of the GAA transistor structure 200 (e.g., the lengthwise direction of an active/dummy gate structure of the GAA transistor structure 200).

The substrate 202 may be a semiconductor substrate, such as a bulk semiconductor, a semiconductor-on-insulator (SOI) substrate, or the like, which may be doped (e.g., with a p-type or an n-type dopant) or undoped. In some embodiments, the substrate 202 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. For example, the semiconductor material of the substrate 202 may include silicon; a compound semiconductor including silicon carbide, gallium arsenic, gallium phosphide, indium phosphide, indium arsenide, and/or indium antimonide; an alloy semiconductor including, GaAsP, AlInAs, AlGaAs, GaInAs, GaInP, and/or GaInAsP; or combinations thereof.

Figure 3:
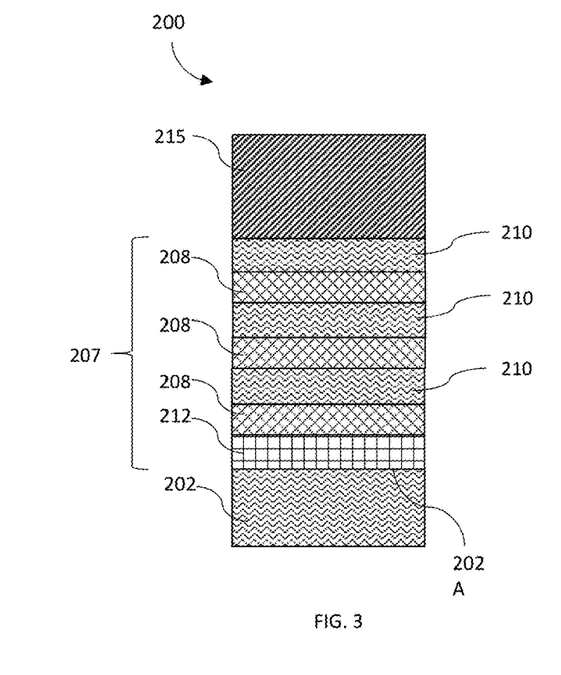

Corresponding to operation 104 of FIG. 1, FIG. 3 is a cross-sectional view of the GAA transistor structure 200 including a layer stack 207 disposed on a first side (e.g., frontside) surface 202A of the substrate 202 at one of the various stages of fabrication. In some embodiments, the cross-sectional view of FIG. 2 may be cut in a direction perpendicular to the lengthwise direction of one or more channels of the GAA transistor structure 200 (e.g., the lengthwise direction of an active/dummy gate structure of the GAA transistor structure 200).

As shown, the layer stack 207 includes a number of first semiconductor layers 208 and a number of second semiconductor layers 210 alternatingly disposed on top of one another along a vertical direction. As will be discussed below, the first semiconductor layers 208 may be later removed or replaced with the wrapping gate structure of a GAA transistor and the second semiconductor layers 210 may collectively function as the channel of a GAA transistor. Accordingly, the first semiconductor layers 208 and second semiconductor layers 210 are sometimes referred to as "sacrificial layers 208" and "channel layers 210," respectively. For example in FIG. 3, one of the second semiconductor layers 210 is disposed over one of the first semiconductor layers 208 then another one of the first semiconductor layers 208 is disposed over the second semiconductor layer 210, so on and so forth.

The semiconductor layers 208 and 210 may have respective different thicknesses. Further, the first semiconductor layers 208 may have different thicknesses from one layer to another layer. The second semiconductor layers 210 may have different thicknesses from one layer to another layer. The thickness of each of the semiconductor layers 208 and 210 may range from few nanometers to few tens of nanometers. In some embodiments, the bottommost layer of the stack 207 may be thicker than other semiconductor layers 208 and 210. In an embodiment, each of the first semiconductor layers 208 has a thickness ranging from about 5 nanometers (nm) to about 20 nm, and each of the second semiconductor layers 210 has a thickness ranging from about 5 nm to about 20 nm.

The first and second semiconductor layers 208 and 210 have different compositions. In various embodiments, the semiconductor layers 208 and 210 have compositions that provide for different oxidation rates and/or different etch selectivity between the layers. In an embodiment, the first semiconductor layers 208 each include silicon germanium ($Si_{1-x}Ge_x$), and the second semiconductor layers 210 each include silicon (Si). In an embodiment, each of the semiconductor layers 210 is silicon that may be undoped or substantially dopant-free (e.g., having an extrinsic dopant concentration from about 0 $cm^{-3}$ to about $1 \times 10^{17}$ $cm^{-3}$), where for example, no intentional doping is performed when being forming. Each of the semiconductor layers 208 is $Si_{1-x}Ge_x$ that includes less than 50% (x<0.5) Ge in molar ratio. For example, Ge may comprise about 15% to 35% of the semiconductor layers 208 of $Si_{1-x}Ge_x$ in molar ratio. Furthermore, the first semiconductor layers 208 may include different compositions among them, and the second semiconductor layers 210 may include different compositions among them.

Either of the semiconductor layers 208 and 210 may include other materials, for example, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. The materials of the semiconductor layers 208 and 210 may be chosen based on providing differing oxidation rates and/or etch selectivity.

In some embodiments, the stack 207 further includes an optional semiconductor layer 212 interposed between the bottommost first semiconductor layer 208 and the substrate 202. The semiconductor layer 212 may be similar to the first semiconductor layer 208, but with a different germanium molar ratio (e.g., higher than the germanium molar ratio of the first semiconductor layer 208).

The semiconductor layers 208 and 210 can be epitaxially grown from the substrate 202 or the semiconductor layer 212 (if formed). For example, each of the semiconductor layers 208 and 210 may be grown by a molecular beam epitaxy (MBE) process, a chemical vapor deposition (CVD) process such as a metal organic CVD (MOCVD) process, and/or other suitable epitaxial growth processes. During the epitaxial growth, the crystal structure of the substrate 202 or the semiconductor layer 212 can extend upwardly, resulting in the semiconductor layers 208 and 210 having the same or similar crystal orientation with the substrate 202 or the semiconductor layer 212.

Figure 4:
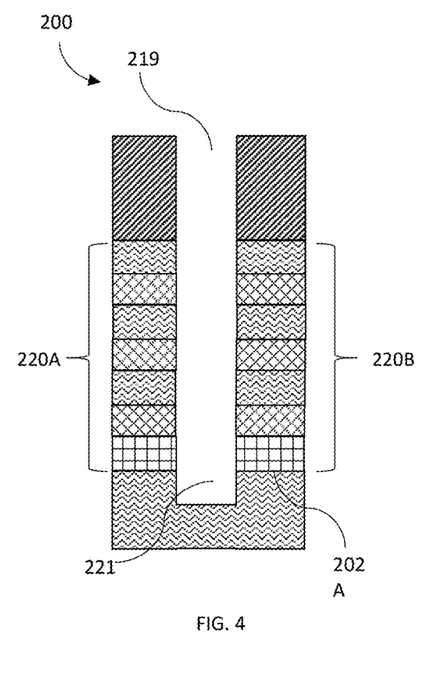

Corresponding to operation 106 of FIG. 1, FIG. 4 is a cross-sectional view of the GAA transistor structure 200 in which a number of active regions, e.g., 220A and 220B, are defined on the first side 202A of the substrate 202, at one of the various stages of fabrication. In some embodiments, the cross-sectional view of FIG. 4 may be cut in a direction perpendicular to the lengthwise direction of one or more channels of the GAA transistor structure 200 (e.g., the lengthwise direction of an active/dummy gate structure of the GAA transistor structure 200).

Upon forming the stack 207, the stack 207 may be patterned to form the active regions, e.g., 220A and 220B. For example, a mask layer 215 (which can include multiple layers such as, for example, a pad oxide layer and an overlying pad nitride layer) is formed over the topmost semiconductor layer (e.g., 210 in FIG. 4). The pad oxide layer may be a thin film comprising silicon oxide formed, for example, using a thermal oxidation process. The pad oxide layer may act as an adhesion layer between the topmost semiconductor layer 210 and the overlying pad nitride layer. In some embodiments, the pad nitride layer is formed of silicon nitride, silicon oxynitride, silicon carbonitride, the like, or combinations thereof. The pad nitride layer may be formed using low-pressure chemical vapor deposition (LPCVD) or plasma enhanced chemical vapor deposition (PECVD), for example.

Next, the mask layer 215 may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer and pad nitride layer to form a patterned mask.

The patterned mask can be subsequently used to pattern exposed portions of the semiconductor layers 208 and 210 to form trench (or opening) 219, thereby defining the active regions 220A and 220B between adjacent trenches. When multiple active regions are formed, such a trench may be disposed between any adjacent ones of the active regions. In some embodiments, the active regions 220A and 220B are formed by etching trenches in the semiconductor layers 208, 210, and 212 (if formed) using, for example, reactive ion etch (RIE), neutral beam etch (NBE), the like, or combinations thereof. The etch may be anisotropic. The etch may stop when a recess 211 is formed along the first side surface of the substrate 202. In some embodiments, a plural number of the trenches 219 (together with corresponding recesses 221) may be strips (when viewed from the top) parallel to each other, and closely spaced with respect to each other. In some embodiments, the trenches 219 (together with the recesses 221) may each be continuous and surround a corresponding one of the active regions 220A-B.

Figure 5:
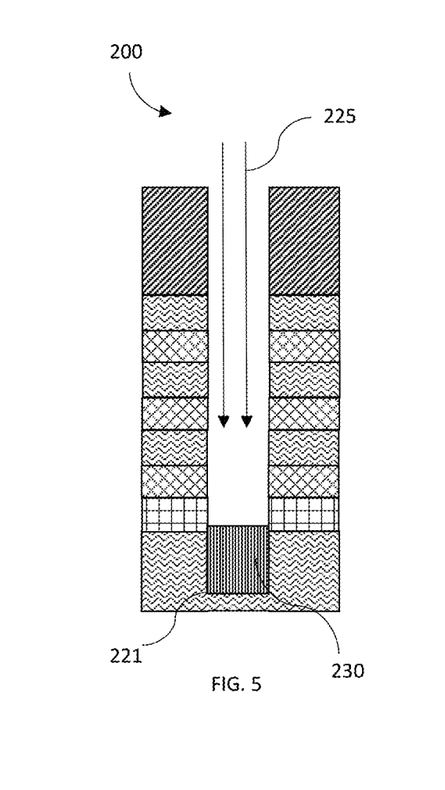

Corresponding to operation 108 of FIG. 1, FIG. 5 is a cross-sectional view of the GAA transistor structure 200 including a number of isolation structures 230, at one of the various stages of fabrication. In some embodiments, the cross-sectional view of FIG. 5 may be cut in a direction perpendicular to the lengthwise direction of one or more channels of the GAA transistor structure 200 (e.g., the lengthwise direction of an active/dummy gate structure of the GAA transistor structure 200).

The isolation structure 230 can be formed by filling at least the recess 221. As such, the isolation structure 230 may be formed between adjacent active regions 220A and 220B, or next to a single active region 220A or 220B. The isolation structures 230, which are formed of an insulation material, can electrically isolate neighboring active regions from each other. In some embodiments, the insulation material may include silicon nitride or other dielectric materials (e.g., $AlO_x$) that are suitable for stopping a polishing process, which will be discussed below. Further, in some embodiments, the isolation structure 230 may be formed by a directional deposition process 225. For example, the deposition process 225 may include a gas cluster ion beam (GCIB) deposition process of gas cluster ions formed from a gas mixture, which may include silicon-containing gas and nitrogen-containing gas. As a non-limiting example, the silicon-containing gas can include silane ($SiH_4$), disilane ($Si_2H_6$), dichlorosilane ($SiH_2Cl_2$), trichlorosilane ($SiCl_3H$), diethylsilane ($C_4H_{12}Si$), trimethylsilane ($C_3H_{10}Si$), silicon tetrachloride ($SiCl_4$), silicon tetrafluoride ($SiF_4$), or a combinations thereof; and the nitrogen-containing gas can include $N_2$, $NH_3$, $NF_3$, $NO$, $N_2O$, $NO_2$.

Following formation of the isolation structures 230, a dummy gate structure (not shown) can be formed to straddle the active regions 220A-B. As such, the dummy gate structure and the active regions 220A-B can have their lengthwise directions perpendicular to each other. Next, source/drain structures (not shown) can be formed on opposite sides of the dummy gate structure (along the lengthwise direction of the active regions 220A-B). In some embodiments, the source/drain structures may be epitaxially grown from the first semiconductor layers 208 and second semiconductor layers 210 of each of the active regions 220A-B.

Figure 6:
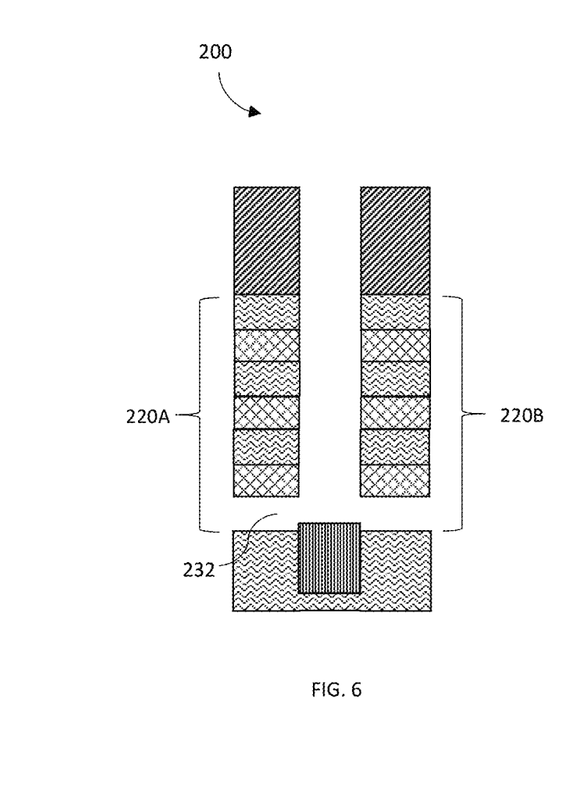

Corresponding to operation 110 of FIG. 1, FIG. 6 is a cross-sectional view of the GAA transistor structure 200 in which the semiconductor layer 212 is removed from each of the active regions 220A-B to form an opening 232, at one of the various stages of fabrication. In some embodiments, the cross-sectional view of FIG. 6 may be cut in a direction perpendicular to the lengthwise direction of one or more channels of the GAA transistor structure 200 (e.g., the lengthwise direction of an active/dummy gate structure of the GAA transistor structure 200). In some embodiments, the removal of the semiconductor layer 212 may be performed by an etching process selective to the semiconductor layer 212. For example, the etching process may have a relatively large etching rate on the semiconductor layer 212 (e.g., SiGe having higher germanium molar ratio), while leaving the semiconductor layers 208 (e.g., SiGe having lower germanium molar ratio), the semiconductor layers 210 (e.g., Si), the isolation structure 230, and the substrate 202 substantially intact.

Figure 7:
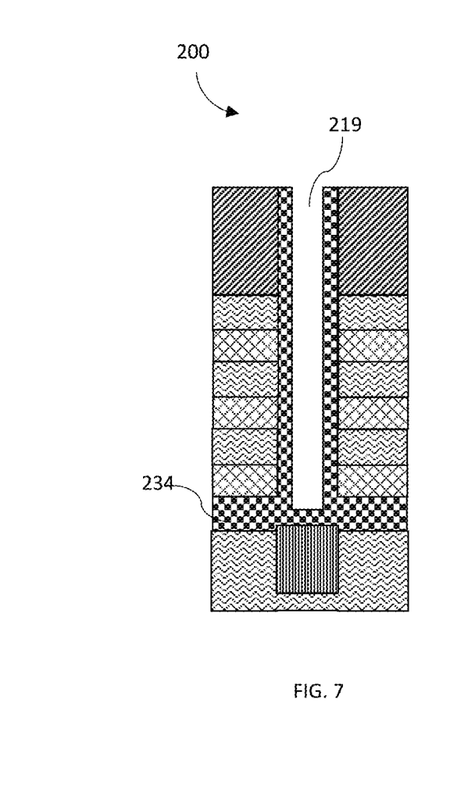
Figure 8:
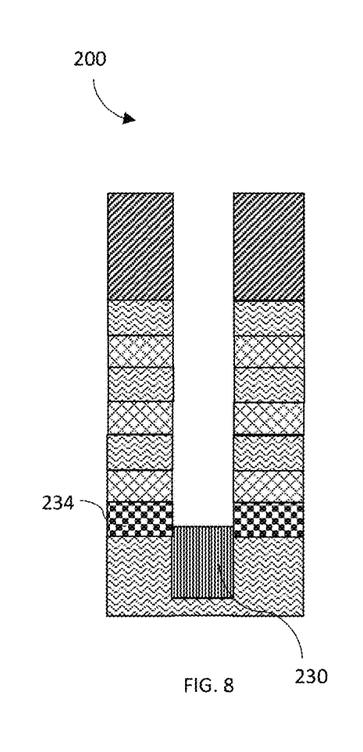

Corresponding to operation 112 of FIG. 1, FIGS. 7 and 8 are cross-sectional views of the GAA transistor structure 200 in which a dielectric material 234 is formed, at one of the various stages of fabrication. In some embodiments, the cross-sectional views of FIGS. 7 and 8 may be cut in a direction perpendicular to the lengthwise direction of one or more channels of the GAA transistor structure 200 (e.g., the lengthwise direction of an active/dummy gate structure of the GAA transistor structure 200).

Referring to FIG. 7, the dielectric material 234 is first deposited over the workpiece to at least extend along (inner) sidewalls of the active regions 220A-B and fill the opening 232. In some embodiments, the dielectric material 234 includes silicon nitride or other dielectric materials, which may be formed by atomic layer deposition (ALD). Following the deposition of the dielectric material 234, a directional etching process may be performed to remove portions of the dielectric material 234 that are not overlaid by the active region 220A or 220B, thereby again exposing the isolation structure 230, as shown in FIG. 8.

Figure 9:
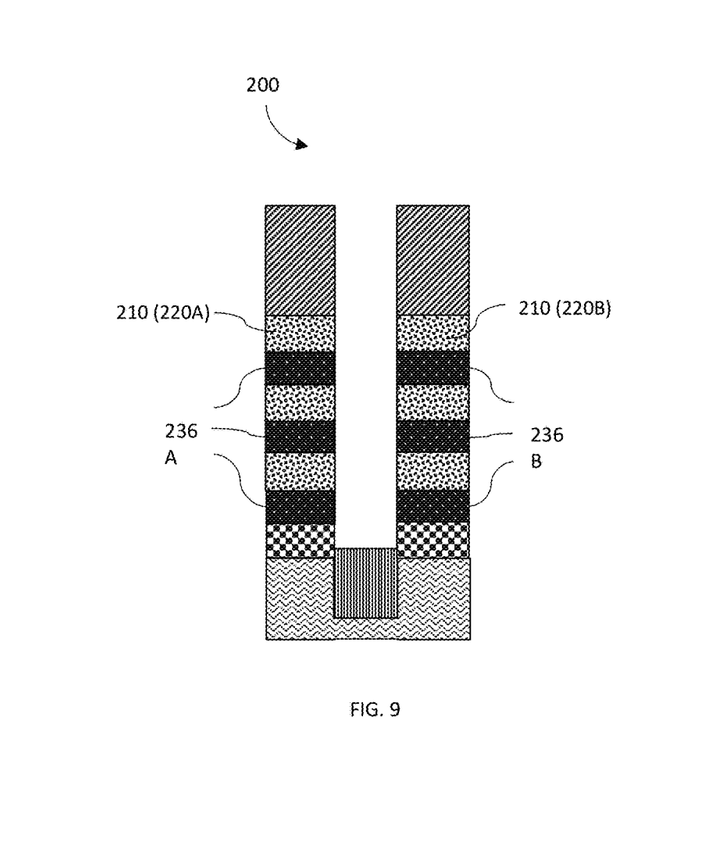

Corresponding to operation 114 of FIG. 1, FIG. 9 is a cross-sectional view of the GAA transistor structure 200 in which the dummy gate structure (not shown) and the semiconductor layers (sacrificial layers) 208 are replaced with one or more active (e.g., metal) gate structures 236A and 236B, at one of the various stages of fabrication. In some embodiments, the cross-sectional view of FIG. 9 may be cut in a direction perpendicular to the lengthwise direction of one or more channels of the GAA transistor structure 200 (e.g., the lengthwise direction of an active/dummy gate structure of the GAA transistor structure 200).

The active gate structures 236A may wrap around the semiconductor layers (channel layers) 210 of the corresponding active region 220A, and the active gate structures 236B may wrap around the semiconductor layers (channel layers) 210 of the corresponding active region 220B. Upon forming the active gate structures 236A and 236B, two transistors (e.g., GAA transistors) can be formed, in some embodiments. The first transistor may have the channel layers 210 of the active region 220A functioning as its channel, with the active gate structure 236A functioning as is gate that wraps around each of the channel layers. Similarly, the second transistor may have the channel layers 210 of the active region 220B functioning as its channel, with the active gate structure 236B functioning as is gate that wraps around each of the channel layers.

The active gate structures 236A-B can each include a gate dielectric and a gate metal, in some embodiments. The gate dielectric may be formed of different high-k dielectric materials or a similar high-k dielectric material. Example high-k dielectric materials include a metal oxide or a silicate of Hf, Al, Zr, La, Mg, Ba, Ti, Pb, and combinations thereof. The gate dielectric may include a stack of multiple high-k dielectric materials. The gate dielectric can be deposited using any suitable method, including, for example, molecular beam deposition (MBD), atomic layer deposition (ALD), PECVD, and the like. The gate metal may include a stack of multiple metal materials. For example, the gate metal may be a p-type work function layer, an n-type work function layer, multi-layers thereof, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. The work function layer(s) may be deposited by CVD, physical vapor deposition (PVD), ALD, and/or other suitable process.

Figure 10:
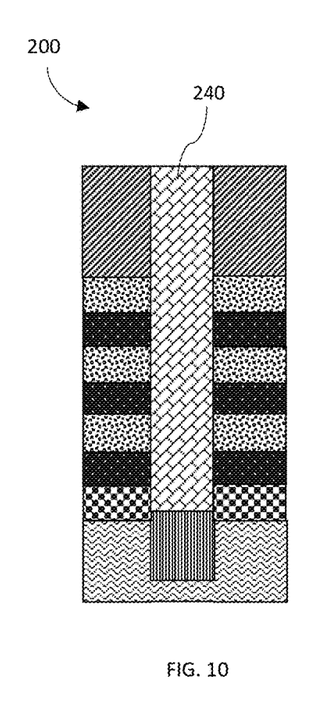

Corresponding to operation 116 of FIG. 1, FIG. 10 is a cross-sectional view of the GAA transistor structure 200 including an interlayer dielectric (ILD) material 240, at one of the various stages of fabrication. In some embodiments, the cross-sectional view of FIG. 10 may be cut in a direction perpendicular to the lengthwise direction of one or more channels of the GAA transistor structure 200 (e.g., the lengthwise direction of an active/dummy gate structure of the GAA transistor structure 200).

As shown, the ILD material 240 may fill up the trench 219 that can further electrically isolate the active regions 220A and 220B (and their corresponding active gate structures) from each other. The ILD material 240 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD is formed, an optional dielectric layer (not shown) is formed over the ILD material 240. The dielectric layer can function as a protection layer to prevent or reduces the loss of the ILD material 240 in subsequent etching processes. The dielectric layer may be formed of a suitable material, such as silicon nitride, silicon carbonitride, or the like, using a suitable method such as CVD, PECVD, or FCVD. If the dielectric layer is formed, a planarization process, such as a CMP process, may be performed to achieve a level top surface for the dielectric layer (or the ILD material 240 if no such a dielectric layer is formed) and the mask layer 215.

Figure 11:
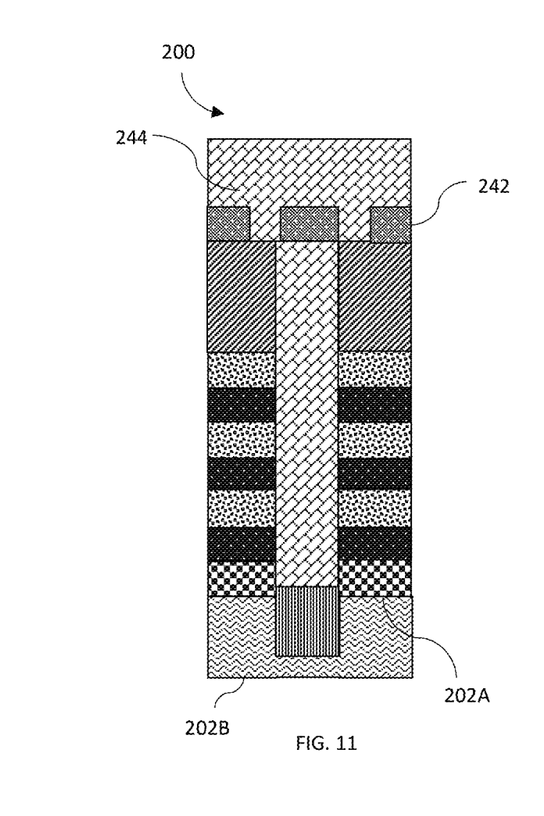

Corresponding to operation 118 of FIG. 1, FIG. 11 is a cross-sectional view of the GAA transistor structure 200 including a number of first interconnect structures 242, at one of the various stages of fabrication. In some embodiments, the cross-sectional view of FIG. 11 may be cut in a direction perpendicular to the lengthwise direction of one or more channels of the GAA transistor structure 200 (e.g., the lengthwise direction of an active/dummy gate structure of the GAA transistor structure 200).

As shown, the first interconnect structures 242 are formed on the first side 202A of the substrate 202. Accordingly, the first interconnect structures 242 are sometimes referred to as frontside interconnect structures 242. Further, the first interconnect structures 242, which include a number of line structures and via structures, can be embedded in an inter-metal dielectric (IMD) material 244. The first interconnect structures 242 are formed of a metal material such as copper, aluminum, tungsten, cobalt, or the like. The first interconnect structures 242 may be formed by a damascene process, e.g., depositing the IMD material 244, etching the IMD material 244 to form trenches, and filling the trenches with the above-mentioned metal material. The IMD material 244 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD.

Figure 12:
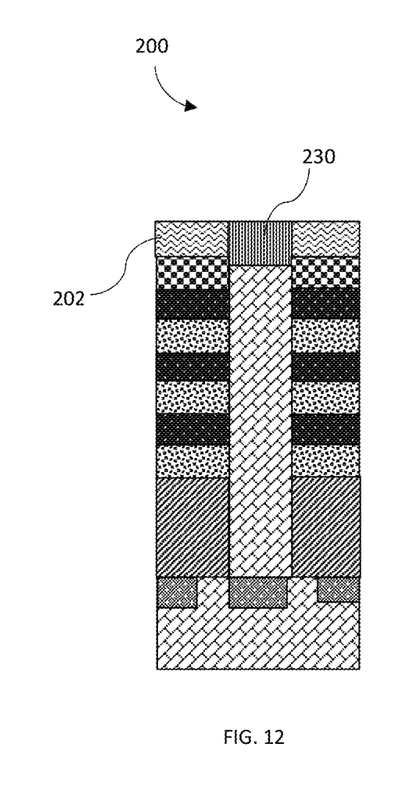

Corresponding to operation 120 of FIG. 1, FIG. 12 is a cross-sectional view of the GAA transistor structure 200 in which the substrate 202 is polished from its second side (e.g., backside) 202B (FIG. 11), at one of the various stages of fabrication. In some embodiments, the cross-sectional view of FIG. 12 may be cut in a direction perpendicular to the lengthwise direction of one or more channels of the GAA transistor structure 200 (e.g., the lengthwise direction of an active/dummy gate structure of the GAA transistor structure 200). Upon forming the frontside interconnect structures 242, the workpiece may be flipped, followed by a polishing process, e.g., a chemical mechanical polishing (CMP) process. In some embodiments, the polishing process can remove a certain portion of the substrate 202 until a bottom surface of the isolation structure 230 is exposed. In other words, the isolation structure 230, formed of silicon nitride, can serve as a stop layer for the polishing process.

Figure 13:
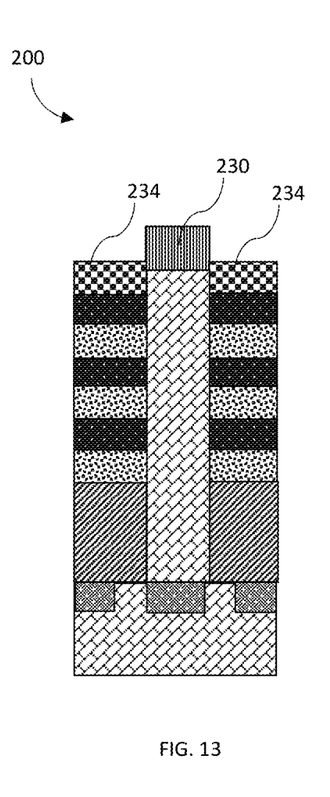
Figure 14:
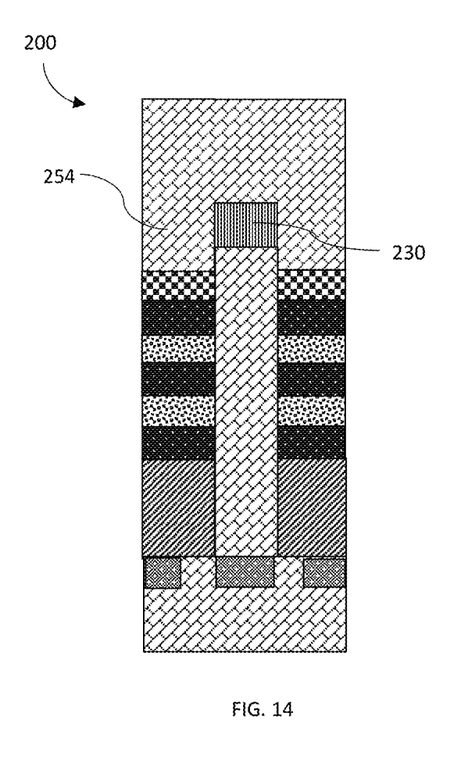

Corresponding to operation 122 of FIG. 1, FIG. 13 is a cross-sectional view of the GAA transistor structure 200 in which a remaining portion of the substrate 202 is removed, at one of the various stages of fabrication. In some embodiments, the cross-sectional view of FIG. 13 may be cut in a direction perpendicular to the lengthwise direction of one or more channels of the GAA transistor structure 200 (e.g., the lengthwise direction of an active/dummy gate structure of the GAA transistor structure 200). Upon the bottom surface of the isolation structure 230 is exposed, an etching process may be performed to remove the remaining portion of the substrate 202, thereby partially exposing sidewalls of the isolation structure 230. In some embodiments, the etching process is selective to the substrate 202. For example, the etching process may have a relatively large etching rate on the substrate 202 (e.g., Si), while leaving the dielectric material 234 and the isolation structure 230 substantially intact Corresponding to operation 124 of FIG. 1, FIG. 14 is a cross-sectional view of the GAA transistor structure 200 in which another IMD material 254 is deposited over the second side, at one of the various stages of fabrication. In some embodiments, the cross-sectional view of FIG. 14 may be cut in a direction perpendicular to the lengthwise direction of one or more channels of the GAA transistor structure 200 (e.g., the lengthwise direction of an active/dummy gate structure of the GAA transistor structure 200). As shown, the IMD material 254 can be deposited to overlay the exposed sidewalls and bottom surface of the isolation structure 230. The IMD material 254 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD.

Figure 15:
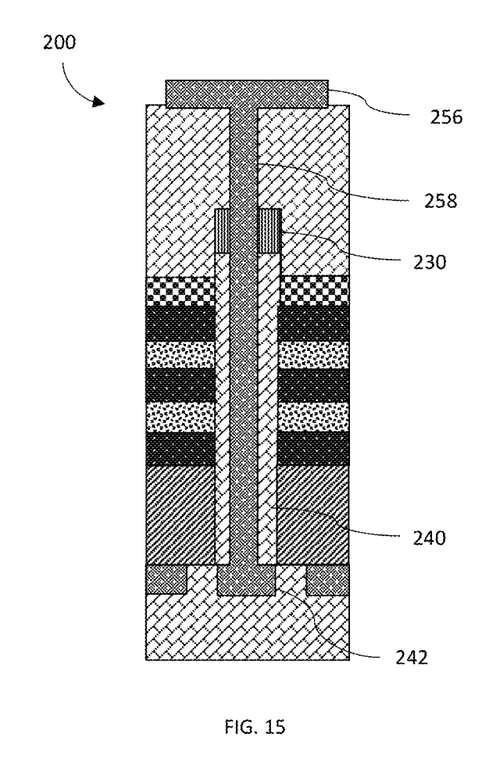

Corresponding to operation 126 of FIG. 1, FIG. 15 is a cross-sectional view of the GAA transistor structure 200 including a number of second interconnect structures 256, at one of the various stages of fabrication. In some embodiments, the cross-sectional view of FIG. 15 may be cut in a direction perpendicular to the lengthwise direction of one or more channels of the GAA transistor structure 200 (e.g., the lengthwise direction of an active/dummy gate structure of the GAA transistor structure 200).

As shown, the second interconnect structure 256 is formed on the second side 202B of the substrate 202. Accordingly, the second interconnect structure 256 is sometimes referred to as a backside interconnect structure 256. The second interconnect structure 256 is formed of a metal material such as copper, aluminum, tungsten, cobalt, or the like. In some embodiments, the second interconnect structure 256 can be configured as a backside power rail, e.g., configured to deliver power from the backside to the features formed on the frontside. In some embodiments, the GAA transistor structure 200 can include a via structure 258 connecting the second (backside) interconnect structure 256 to at least one of the first (frontside) interconnect structure 242. The via structure 258 can extend from the backside interconnect structure 256, through the IMD material 254, the isolation structure 230, and the ILD material 240, to the frontside interconnect structure 242.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method for fabricating semiconductor devices, comprising:
   forming, on a first side of a substrate, a first stack and a second stack;
   etching, from the first side, a portion of the substrate interposed between the first and second stacks to form a recess in the substrate;
   filling the recess with a dielectric material to form an isolation structure at least partially in the substrate, the isolation structure formed prior to forming a gate structure on the first stack or second stack, wherein the isolation structure is formed not to extend past a bottom layer of the first and second stacks;
   forming, on the first side, one or more first interconnect structures over the first and second stacks;
   removing, from a second side of the substrate opposite to the first side, a remaining portion of the substrate;
   forming a via structure extending through at least the isolation structure; and
   forming, on the second side, one or more second interconnect structures.

2. The method of claim 1, wherein each of the first and second stacks includes a plurality of first semiconductor layers and a plurality of second semiconductor layers alternately stacked on top of one another.

3. The method of claim 2, further comprising:
   removing the plurality of second semiconductor layers of the first and second stacks; and
   forming a first metal gate structure around each of the plurality of first semiconductor layers of the first stack and a second metal gate structure around each of the plurality of first semiconductor layers of the second stack.

4. The method of claim 1, wherein at least one of the one or more first interconnect structures is connected to at least one of the one or more second interconnect structures through the via structure.

5. The method of claim 1, wherein the step of filling the recess with a dielectric material further comprises utilizing gas cluster ion beam to deposit the dielectric material.

6. The method of claim 4, wherein the dielectric material includes silicon nitride.

7. The method of claim 1, wherein the step of removing a remaining portion of the substrate further comprises:
   polishing a first remaining portion of the substrate until a bottom surface of the isolation structure is exposed; and
   etching a second remaining portion of the substrate to expose partial sidewalls of the isolation structure.

8. The method of claim 7, wherein the dielectric material is configured to stop the polishing step.

9. The method of claim 7, further comprising depositing, on the second side, an oxide material to overlay at least the bottom surface and the exposed sidewalls of the isolation structure.

10. The method of claim 9, wherein the via structure further extends through the oxide material.

11. A method for fabricating semiconductor devices, comprising:
    etching, from a first side of a substrate, a portion of the substrate to form a recess in the substrate;
    filling the recess with a dielectric material to form an isolation structure at least partially in the substrate, the isolation structure formed prior to forming a gate structure on the first stack or second stack, wherein the isolation structure is formed not to extend past a bottom layer of the first and second stacks;
    forming, on the first side, a first interconnect structure;
    polishing, from a second side of the substrate, a first remaining portion of the substrate until a bottom surface of the isolation structure is exposed;
    etching, from the second side, a second remaining portion of the substrate;
    forming a via structure extending through at least the isolation structure; and
    forming, on the second side, a second interconnect structure in connection with the first interconnect structure through the via structure.

12. The method of claim 11, wherein the dielectric material includes silicon nitride.

13. The method of claim 11, wherein the dielectric material is configured to stop the polishing step.

14. The method of claim 11, further comprising depositing, on the backside, an oxide material.

15. The method of claim 14, wherein the via structure further extends through the oxide material.

16. The method of claim 11, further comprising:
    forming, on the frontside, a stack over the substrate, wherein the stack includes a plurality of first semiconductor layers and a plurality of second semiconductor layers alternately stacked on top of one another; and prior to forming the recess, separating the stack into a first portion and a second portion, wherein the recess in is interposed between the first and second portions of the stack.

17. The method of claim 11, wherein the step of filling the recess with a dielectric material further comprises utilizing gas cluster ion beam to deposit the dielectric material.

* * * * *